(12) United States Patent
Tanaka et al.

(10) Patent No.: US 11,101,199 B2
(45) Date of Patent: Aug. 24, 2021

(54) POWER SEMICONDUCTOR DEVICE

(71) Applicant: Mitsubishi Electric Corporation, Tokyo (JP)

(72) Inventors: Saburo Tanaka, Tokyo (JP); Tatsuya Fukase, Tokyo (JP); Masaki Kato, Tokyo (JP); Norio Emi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/909,438

(22) Filed: Mar. 1, 2018

(65) Prior Publication Data
US 2019/0122966 A1 Apr. 25, 2019

(30) Foreign Application Priority Data
Oct. 25, 2017 (JP) .............................. JP2017-205800

(51) Int. Cl.
*H01L 23/495* (2006.01)
*H01L 23/31* (2006.01)
(Continued)

(52) U.S. Cl.
CPC ........ *H01L 23/49541* (2013.01); *H01L 23/29* (2013.01); *H01L 23/3107* (2013.01); *H01L 23/3121* (2013.01); *H01L 23/36* (2013.01); *H01L 23/49524* (2013.01); *H01L 23/49562* (2013.01); *H01L 23/49575* (2013.01); *H01L 23/62* (2013.01); *H01L 2224/32245* (2013.01); *H01L 2224/40245* (2013.01); *H01L 2924/181* (2013.01)

(58) Field of Classification Search
CPC ... H01L 21/4821–4842; H01L 21/4846–4867; H01L 23/4824; H01L 23/495–498
See application file for complete search history.

(56) References Cited

U.S. PATENT DOCUMENTS

2005/0173783 A1* 8/2005 Chow ............... H01L 23/49589
257/666
2006/0197198 A1* 9/2006 Chow .................... H01L 21/56
257/672
(Continued)

FOREIGN PATENT DOCUMENTS

JP 2014-78646 A 5/2014

*Primary Examiner* — Marcos D. Pizarro
*Assistant Examiner* — Quinton A Brasfield
(74) *Attorney, Agent, or Firm* — Sughrue Mion, PLLC; Richard C. Turner

(57) ABSTRACT

A power semiconductor device is such that a notch provided, along a longitudinal end face of an inner lead, in a region of a lead frame to which the inner lead is bonded. A resistor is disposed, adjacent to the inner lead, on the same side as the notch with respect to the inner lead, and a distance between the inner lead and the notch is set to be smaller than a distance between the inner lead and the resistor, and thereby the inner lead, even when shifted in position, comes into no contact with the resistor. Because of this, it is no more necessary that a space be provided around the inner lead taking into consideration a positional shift of the inner lead, and it is possible to secure the heat release area of power semiconductor chips accordingly, and thus to obtain the small-sized and high-powered power semiconductor device.

17 Claims, 3 Drawing Sheets

(51) Int. Cl.
*H01L 23/62* (2006.01)
*H01L 23/29* (2006.01)
*H01L 23/36* (2006.01)

(56) References Cited

U.S. PATENT DOCUMENTS

2007/0166877 A1* 7/2007 Otremba ........... H01L 23/49513
 438/106
2010/0219518 A1* 9/2010 Hsu ..................... H01L 23/4951
 257/676
2013/0320818 A1* 12/2013 Oga ....................... H01L 24/73
 310/68 D

* cited by examiner

POWER SEMICONDUCTOR DEVICE

BACKGROUND OF THE INVENTION

Field of the Invention

The present invention relates to a power semiconductor device on which switchable power semiconductor chips are mounted.

Description of the Related Art

A power semiconductor device is such that switchable power semiconductor chips are mounted on a lead frame formed in a wiring pattern and are sealed with a molding resin. A power conversion circuit is configured by a single such power semiconductor device or by combining a plurality thereof.

As the power semiconductor chips generate heat by being supplied with a current, causing a rise in the temperature thereof, it is necessary to control the current to be supplied to the power semiconductor chips so as not to exceed a predetermined allowable temperature. In other words, the rise in the temperature of the power semiconductor chips when supplied with the current is controlled, and thereby it is possible to increase the value of the current to be supplied, thus enabling an operation at the maximum power in the range where the temperature of the power semiconductor chips when supplied with the current is at or below the allowable temperature. As a result of this, the performance of the power conversion circuit improves, and the power of a power converter can be brought out to the maximum.

Examples of a method of improving the maximum power in the range where the temperature of the power semiconductor chips is at or below the allowable temperature include: to reduce heat loss caused in the power semiconductor chips, to reduce the amount of heat which the power semiconductor chips receive from the outside, to make it easy to release the amount of heat generated in the power semiconductor chips, and to allow power to be inputted to the brisk at which the temperature of the power semiconductor chips, while being monitored, reaches the allowable temperature.

Also, as the power semiconductor device is supplied with a current via a diversity of members, such as bus bars, a lead frame, and power semiconductor chips, and via the connecting portions of these members, it is required to secure connection resistance reduction and connection reliability. For example, in Patent Literature 1, with the aim of securing the resistance reduction and connection reliability of the power semiconductor device, the semiconductor chips and respective plate-like inner leads are bonded in advance using a conductive bonding material, and the semiconductor chips are mounted on a lead frame at a temperature lower than the temperature at which the conductive bonding material starts to remelt.

[Patent Literature 1] JP-A-2014-78646

The heretofore known power semiconductor device has a problem in that, when connecting the top electrode of a power semiconductor chip and the lead frame with a metal inner lead, solder melted due to heat treatment using a reflow unit, or the like, wets and spreads on the lead frame, causing a positional shift of the inner lead. When the inner lead which is shifted in position interferes with the power semiconductor chip, there is fear of a short circuit failure.

In the heretofore known power semiconductor device, a space of, for example, 5 mm or more is provided around the inner lead in order thereby to avoid contact of the inner lead with an adjacent electronic part due to a positional shift of the inner lead, but this prevents the power semiconductor device from being made smaller in size. Also, there is a problem in that the area of the lead frame in which to mount the inner lead is secured, thus narrowing the area of the lead frame in which to mount the power semiconductor chip, and reducing the heat release area of the power semiconductor chip. As a result of this, there is a problem in that it is not possible to sufficiently suppress a rise in the temperature of the power semiconductor chip, and thus not possible to obtain the high-powered power semiconductor device.

As it is not possible to prevent the solder from wetting and spreading on the lead frame with the method proposed in Patent Literature 1, it is necessary to secure the area in which to mount the inner lead, as well as to provide a space around the inner lead. Also, there is a problem in that the process of bonding the semiconductor chip and inner lead in advance is needed, and the bonding by batch heat treatment using a reflow unit or the like cannot be carried out, leading to a decrease in productivity.

SUMMARY OF THE INVENTION

The invention, having been contrived order to solve the heretofore described kinds of problems, has for its object to obtain a power semiconductor device which suppresses a positional shift of an inner lead when bonding the inner lead to a lead frame and which is small in size and high in power.

The power semiconductor device according to the invention includes a lead frame having a plurality of electrically independent regions; switchable power semiconductor chips mounted on the lead frame; metal inner leads which electrically connect the top electrodes of the respective power semiconductor chips and the lead frame; a conductive bonding member which bonds at least the lead frame and the inner leads; and a resin which covers the lead frame, the power semiconductor chips, and the inner leads, wherein a notch is provided, along the inner lead, in a region of the lead frame to which the inner lead is bonded.

According to the invention, the notch is provided, along the inner lead, in the region of the lead frame to which the inner lead is bonded, whereby the conductive bonding member, which is melted in a region where the lead frame and the inner lead are bonded, only wets and spreads to the notch, and thus it is possible to suppress a positional shift of the inner lead. As it is hereby possible to make the distance between the inner lead and an electronic part adjacent to the inner lead smaller than heretofore known, and thus possible to secure the heat release area of the power semiconductor chip, it is possible to obtain the small-sized and high-powered power semiconductor device.

The foregoing and other objects, features, aspects and advantages of the present invention will become more apparent form the following detailed description of the present invention when taken in conjunction with the accompanying drawings.

BRIEF DESCRIPTION OF THE DRAWINGS

FIG. 1 is a plan view showing a power semiconductor device according to Embodiment 2 of the invention.

DETAILED DESCRIPTION OF THE PREFERRED EMBODIMENTS

Embodiment 1

Figure 1:
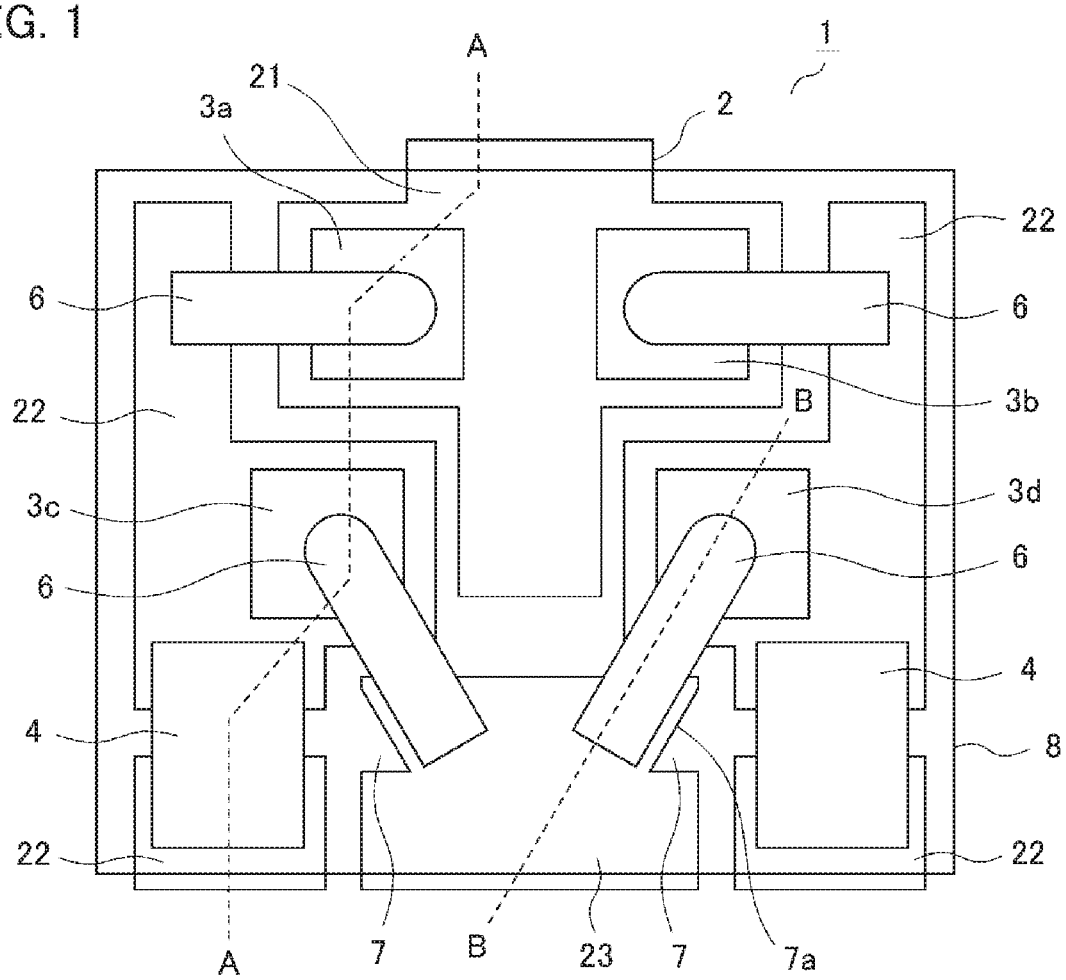
FIG. 1 is a plan view showing a power semiconductor device according to Embodiment 1 of the invention.
Figure 2:
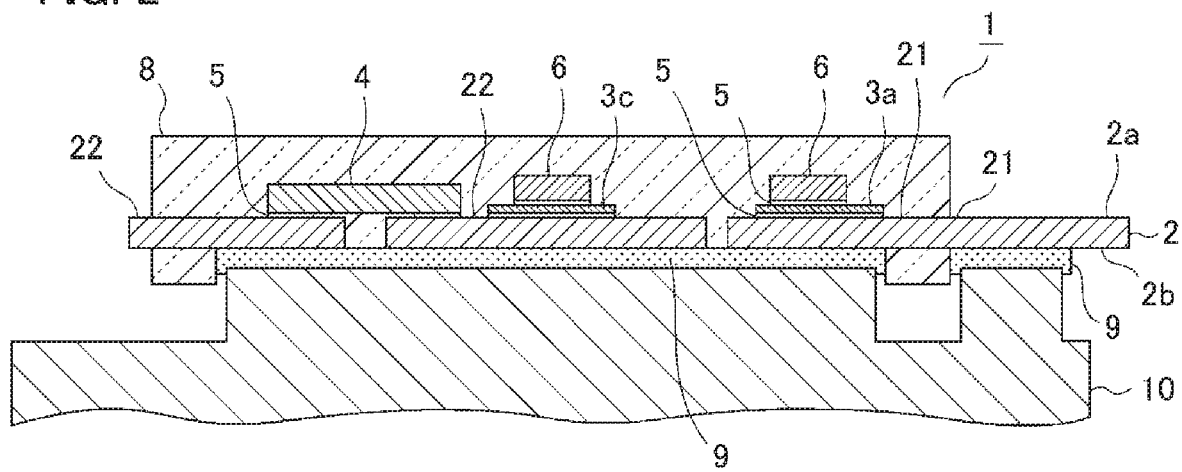
FIG. 2 is a sectional view showing the power semiconductor device according to Embodiment 1 of the invention.
Figure 3:
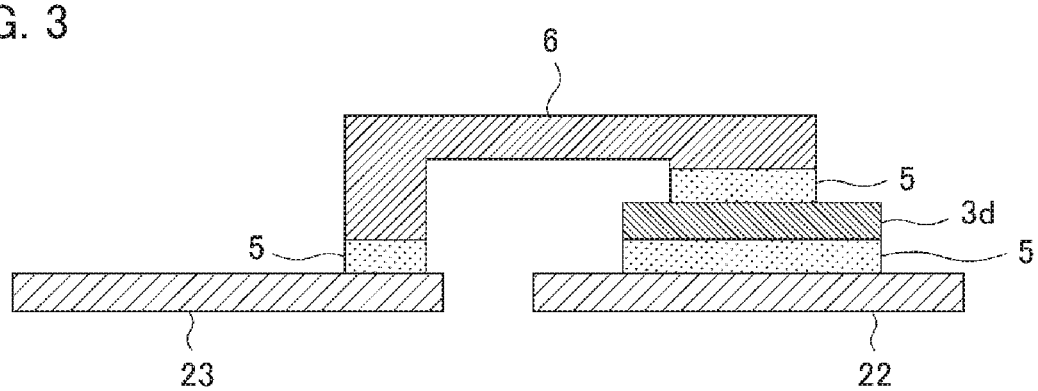
FIG. 3 is a sectional view showing one portion of the power semiconductor device according to Embodiment 1 of the invention.

Hereafter, a description will be given, based on the drawings, of a power semiconductor device according to Embodiment 1 of the invention. FIG. 1 is a plan view schematically showing the power semiconductor device according to Embodiment 1, FIG. 2 is a sectional view of the portion shown by A-A in FIG. 1, and FIG. 3 is a sectional view of the portion shown by B-B in FIG. 1. In the individual drawings, identical signs are given to identical and equivalent portions.

A power semiconductor device 1 according to Embodiment 1 includes a metal lead frame 2, switchable power semiconductor chips 3a, 3b, 3c, and 3d (collectively described as power semiconductor chips 3), current detection resistors 4, solder 5 which is a conductive bonding member, inner leads 6 which are metal wiring members, and a molding resin 8 which covers these parts.

The lead frame 2 configuring the power semiconductor device 1 has a plurality of electrically independent regions 21, 22, and 23. In FIG. 1, the region 21 is a P potential lead, the regions 22 are AC potential leads, and the region 23 is an N potential lead. The power semiconductor chips 3a and 3b, which are two upper power semiconductor chips of a three-phase AC circuit, are mounted in the region 21, and the power semiconductor chips 3c and 3d, which are lower power semiconductor chips of the three-phase AC circuit, are mounted one in each of two regions 22.

Also, the two regions 22 in which the respective power semiconductor chips 3c and 3d are mounted are electrically connected one to each of two regions 22, in which no power semiconductor chip 3 is mounted, by the respective resistors 4 which are shunt resistors or the like. The regions 22 in each of which no power semiconductor chip 3 is mounted are connected one to each external electrode.

Each of the power semiconductor chips 3 is, for example, a metal-oxide semiconductor field-effect transistor (MOSFET) but, not being limited to this, may be an insulated gate bipolar transistor (IGBT). Silicon (Si), silicon carbide (SiC), silicon nitride (SiN), gallium nitride (GaN), gallium arsenide (GaAs), or the like, is used as the base material of the power semiconductor chip 3.

The power semiconductor chip 3 includes on the chip top a gate portion and a gate electrode in addition to a source electrode which is a chip top electrode, and has a chip bottom electrode on the chip bottom (the gate portion and the electrodes are not shown). The chip top electrode of the power semiconductor chip 3 is electrically connected by the inner lead 6 to a region of the lead frame 2 different from the region thereof in which the power semiconductor chip 3 is mounted. The gate electrode is connected, by wire bonding, to a gate terminal configured of one portion of the lead frame 2. When bonding the chip top electrode and inner lead 6 with the solder 5, the chip top electrode is plated with nickel (Ni), thus meeting soldering specifications.

The lead frame 2 is one which is formed in a wiring pattern by etching or pressing an alloy plate with copper (Cu), aluminum (Al), or the like, as a base material. The front surface of the lead frame 2 may be either such that the base metal is exposed therefrom or such that at least one portion thereof is plated.

As shown in FIG. 2, one of the opposing main surfaces of the lead frame 2 is referred to as a mounting surface 2a, while the other is referred to as a heat release surface 2b, and after the power semiconductor chips 3, the inner leads 6, the resistors 4, and the like, are mounted on the mounting surface 2a and sealed with the molding resin 8, a portion unnecessary for electrical wiring is removed. As a result of this, the lead frame 2 is separated, forming the electrically independent regions 21, 22, and 23. Also, a heatsink 10 is bonded to the heat release surfaces 2b via an insulating adhesive 9 high in thermal conductivity.

As shown in FIG. 3, the chip top electrode of the power semiconductor chip 3d and the inner lead 6 are bonded by the solder 5, the chip bottom electrode of the power semiconductor chip 3d and the region 22 of the lead frame 2 are bonded by the solder 5, and the inner lead 6 and the region 23 of the lead frame 2 are bonded by the solder 5. Also, each of the resistors 4 and the regions 22 placed one on either side thereof are also bonded by the solder 5.

The inner lead 6 is one wherein a metal plate is processed in a wiring member shape, and a portion of the inner lead 6 other than the portion thereof connected to the power semiconductor chip 3 or lead frame 2 is in contact with the molding resin 8. Also, the inner lead 6 is disposed so as to be encompassed inside the molding resin 8, and when being manufactured, has no portion that supports the inner lead 6 from the outside. The body of the inner lead 6 is formed in a direction further away from the lead frame 2 than the connecting portion, thus preventing a short circuit with the lead frame 2.

Also, the sectional area of the body of the inner lead 6 is determined by the amount of current to be supplied. The power semiconductor device 1 according to Embodiment 1 is assumed to be supplied with a current of on the order of several amperes to several hundred amperes including even an instantaneously applied current. A through hole and/or a constricted portion is provided in the body of the inner lead 6, and thereby it is possible to increase the longitudinal thermal resistance of the inner lead 6 and thus to reduce the conduction of heat between the power semiconductor chips 3.

Figure 4:
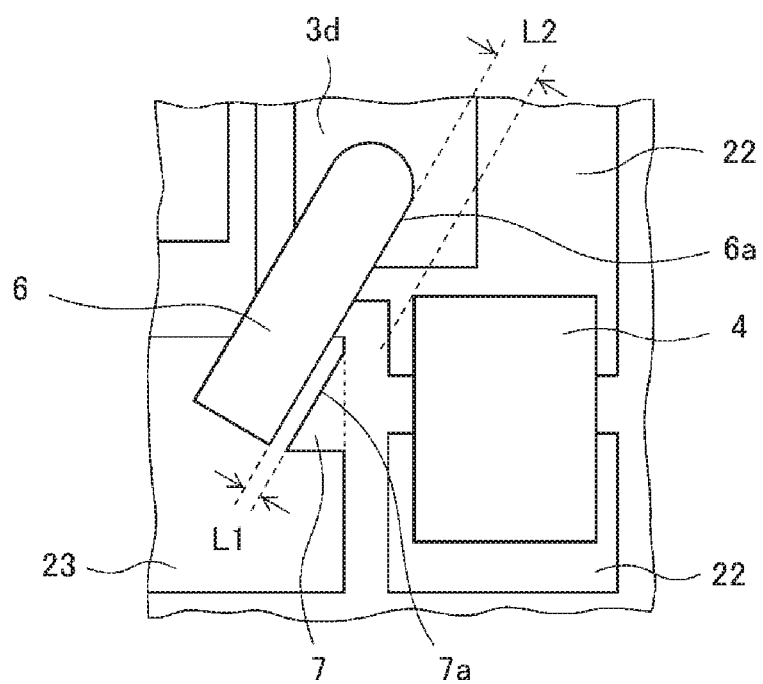
FIG. 4 is a diagram describing a notch provided in a lead frame of the power semiconductor device according to Embodiment 1 of the invention.

The power semiconductor device 1 is such that, as shown in FIG. 4, a notch 7 is provided, along at least one longitudinal end face 6a of the inner lead 6, in the region 23 of the lead frame 2 to which the inner lead 6 is bonded. The notch 7 is provided to narrow the area in which solder which is melted in a portion where the inner lead 6 and the region 23 of the lead frame 2 are bonded, due to heat treatment using a reflow unit or the like, wets and spreads. That is, the melted solder 5 can only wet and spread to a lead frame end 7a of the notch 7.

Also, an electronic part (in Embodiment 1, the resistor 4) is disposed, adjacent to the inner lead 6, on the same side as the notch 7 with respect to the inner lead 6, and the distance between the inner lead 6 and the notch 7 is set to be smaller than the distance between the inner lead 6 and the electronic part. Also, the longitudinal end face 6a of the inner lead 6 and the lead frame end 7a of the notch 7 are set to have an interval of 0.5 mm or more therebetween taking into consideration the positional accuracy of the solder 5. As shown in FIG. 4, when the distance between the longitudinal end face 6a of the inner lead 6 and the notch 7 is represented by L1, and the distance between the longitudinal end face 6a of the inner lead 6 and the electronic part adjacent to the longitudinal end face 6a is represented by L2, L1 and L2 meet 0.5 mm≤L1<L2.

By providing this kind of notch 7, the longitudinal end face 6a of the inner lead 6 only moves to the notch 7 even though a positional shift of the inner lead 6 occurs when mounting, and thus the inner lead 6 comes into no contact with the adjacent resistor 4. In a heretofore known power semiconductor device, a space of 5 mm or more is provided around the inner lead in order thus to avoid contact of the inner lead with the adjacent electronic part due to a positional shift of the inner lead, but this prevents a reduction in the size of the power semiconductor device. In Embodiment 1, by providing the notch 7, it is possible to make the interval between the inner lead 6 and the resistor 1 narrower than heretofore known, thus enabling L2 to meet L2≤5 mm.

In the example shown in FIG. 4, the notch 7 is formed in a right triangle, and the lead frame end 7a which is the hypotenuse of the right triangle is disposed parallel to the longitudinal end face 6a of the inner lead 6. However, any shape of the notch 7 is acceptable as long as the notch 7 is shaped along the inner lead 6, and the notch 7 can be formed in a diversity of shapes, such as a quadrangle or an elongated slit. Also, in FIG. 4, the notch 7 is provided along the one longitudinal end face 6a of the inner lead 6, but when electronic parts are disposed one adjacent to each of the longitudinal end faces on both sides of the inner lead 6, the notches 7 may be provided one along each of the longitudinal end faces on both sides of the inner lead 6.

In Embodiment 1, the two power semiconductor chips 3a and 3b are mounted in the region 21 which is the P potential lead, and the power semiconductor chips 3c and 3d are mounted one in each of the two regions 22 which are the AC potential leads, but the number and disposition of the power semiconductor chips 3 are not limited to these. Two or more power semiconductor chips 3 may be mounted on the P potential lead.

Also, in Embodiment 1, the solder 5 is used as the conductive bonding member, but when strain occurs due to a change in temperature, or the like, when using a power converter, and a difference in durability occurs in a plurality of bonding portions, solders different in composition may be used from one bonding portion to another. Also, the conductive bonding member is not limited to the solder 5, and a conductive resin paste, a sintering paste, or the like, can also be used as the conductive bonding member.

As above, according to Embodiment 1, the notch 7 is provided, along the inner lead 6, in the region 23 of the lead frame 2 to which the inner lead 6 is bonded, whereby the solder 5, which is melted in the portion where the lead frame 2 and the inner lead 6 are bonded, only wets and spreads to the lead frame end 7a of the notch 7, and thus it is possible to suppress a positional shift of the inner lead 6.

Also, the distance L1 between the inner lead 6 and the notch 7 is made smaller than the distance L2 between the inner lead 6 and the electronic part which is disposed, adjacent to the inner lead 6, on the same side as the notch 7 with respect to the inner lead 6, and thereby the inner lead 6 comes into no contact with the electronic part even when the inner lead 6 is shifted in position. Because of this, it is possible to make the distance between the inner lead 6 and the electronic part smaller than heretofore known.

Also, as it is no more necessary that a space be provided between the inner lead 6 and the adjacent electronic part, taking into consideration a positional shift of the inner lead 6, and the heat release area of the power semiconductor chip 3 can be secured accordingly, it is possible to obtain the small-sized and high-powered power semiconductor device 1. Furthermore, as it is possible to carry out the same bonding by batch heat treatment using a reflow unit or the like, as heretofore known, without adding a new step, as well as to prevent a defect caused by contact of the inner lead 6 with the adjacent electronic part, it is possible to achieve an improvement in productivity.

Embodiment 2

Figure 5:
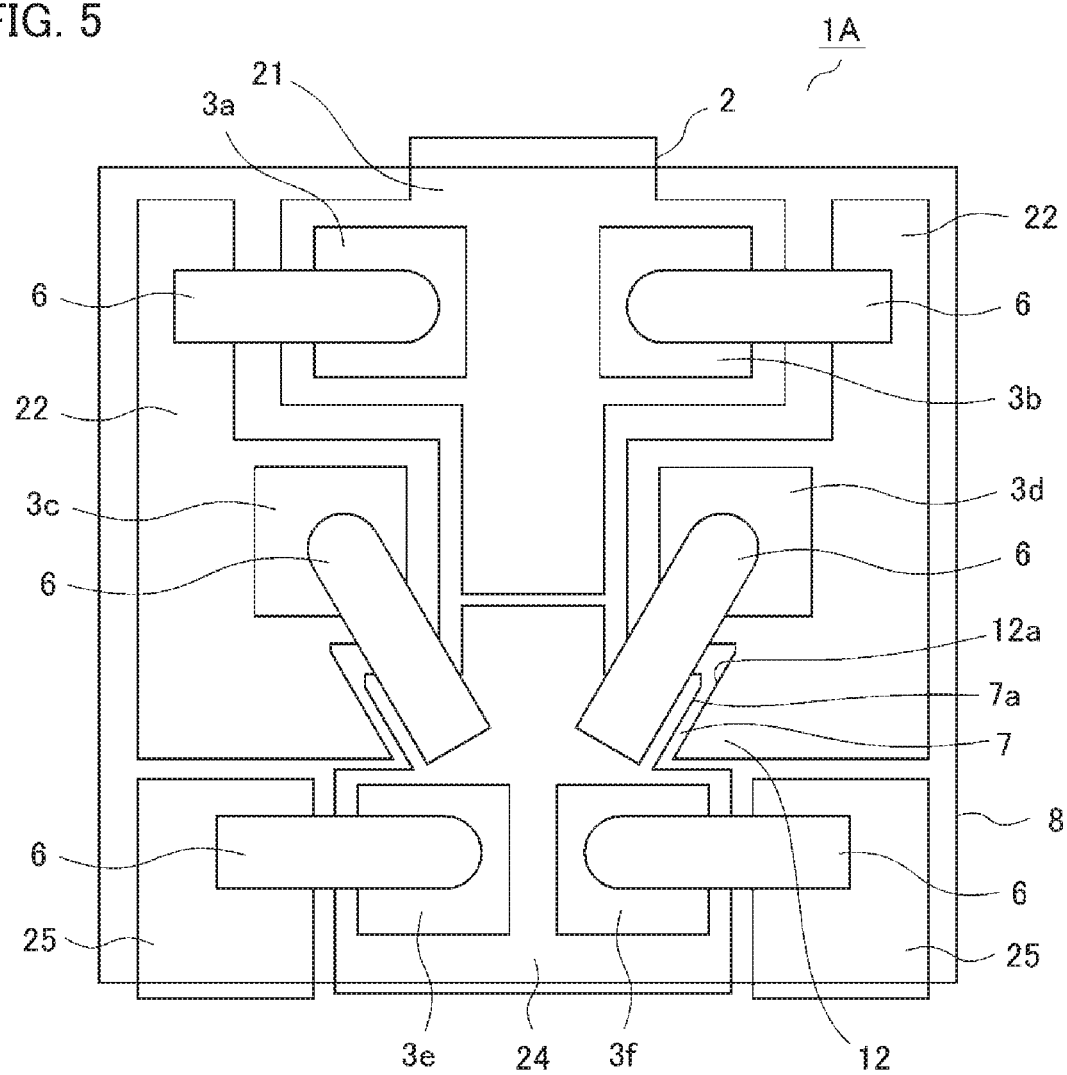

FIG. 5 is a plan view schematically showing a power semiconductor device according to Embodiment 2 of the invention. A lead frame 2 configuring a power semiconductor device 1A according to Embodiment 2 has a plurality of electrically independent regions 21, 22, 24, and 25. In FIG. 5, the region 21 is a P potential lead, the regions 22 and the regions 25 are AC potential leads, and the region 24 is an N potential lead.

The chip top electrodes of semiconductor chips 3c and 3d mounted one in each of the regions 22 are electrically connected to the region 24 by respective inner leads 6. Furthermore, power semiconductor chips 3e and 3f mounted, adjacent to the respective inner leads 6, in the region 24 to which the inner leads 6 are bonded. The chip top electrodes of the power semiconductor chips 3e and 3f are further electrically connected one to each of the regions 25 different from the region 24 by respective inner leads 6.

In the case of the power semiconductor device 1A according to Embodiment 2, as there is fear of a short circuit failure caused by the interference between the inner leads 6 bonded to the region 24 and the respective power semiconductor chips 3e and 3f, a notch 7 is provided between each inner lead 6 and each respective power semiconductor chip 3e and 3f. As this causes the inner lead 6 only to move to a lead frame end 7a of the notch 7 even though a positional shift of the inner lead 6 occurs, the inner lead 6 comes into no contact with each adjacent power semiconductor chip 3e and 3f.

Also, the regions 22 of the lead frame 2, in which the respective power semiconductor chips 3c and 3d are mounted, each have an extended portion 12 which opposes the notch 7 and protrudes into the inside of the notch 7. A lead frame end 12a of the extended portion 12 is provided parallel to the lead frame end 7a of the notch 7. As the area of the regions 22 in which the respective power semiconductor chips 3c and 3d are mounted increases by providing these kinds of extended portions 12, the heat release area of the power semiconductor chips 3c and 3d increases, thus suppressing a rise in the temperature of the power semiconductor chips 3c and 3d. As other configurations of the power semiconductor device 1A are the same as in Embodiment 1, a description thereof is omitted.

In the example shown in FIG. 5, the notch 7 is formed in a triangle, and the lead frame end 7a which forms one side of the triangle is disposed parallel to a longitudinal end face 6a of the inner lead 6. However, any shape of the notch 7 is acceptable as long as the notch 7 is shaped along the inner lead 6, and the notch 7 can be formed in a diversity of shapes, such as a quadrangle or an elongated slit.

According to Embodiment 2, the notch 7 is provided between each inner lead 6 and each respective power semiconductor chip 3e and 3f, which are mounted in the same region 24, whereby solder 5, which is melted in the portion where the lead frame 2 and the inner lead 6 are bonded, only wets and spreads to the lead frame end 7a of the notch 7, and thus it is possible to suppress a positional shift of the inner lead 6. Because of this, it is possible to make the distance between each inner lead 6 and each respective power semiconductor chip 3e and 3f smaller than heretofore known.

Also, as the inner lead 6, even when shifted in position, comes into no contact with each respective power semiconductor chip 3e and 3f, it is possible to prevent a short circuit failure caused by the interference between the inner lead 6 and each respective power semiconductor chip 3e and 3f. Furthermore, the extended portion 12 opposite to the notch 7 is provided in each of the regions 22 where the respective power semiconductor chips 3c and 3d are mounted, whereby the heat release area of the power semiconductor chips 3c and 3d increases, and thus it is possible to suppress a rise in the temperature of the power semiconductor chips 3c and 3d.

For these reasons, according to Embodiment 2, the small-sized and high-powered power semiconductor device 1A can be obtained. The invention is such that the individual embodiments can be freely combined, or any of the individual embodiments can be appropriately modified or omitted, within the scope of the invention.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor device, comprising:
a lead frame having a plurality of electrically independent regions;
switchable power semiconductor chips mounted on the lead frame;
metal inner leads which electrically connect the top electrodes of the respective power semiconductor chips and the lead frame;
a conductive bonding member which bonds at least the lead frame and the inner leads; and
a resin which covers the lead frame, the power semiconductor chips, and the inner leads, wherein
a notch is provided, along at least one inner lead of the inner leads, in a region of the lead frame to which the inner lead is bonded, and wherein
the power semiconductor device further comprises an electronic part which is disposed, adjacent to the inner lead, on the same side as the notch with respect to the inner lead, and wherein
a distance between the inner lead and the notch is smaller than a distance between the inner lead and the electronic part.

2. The power semiconductor device according to claim 1, wherein
the power semiconductor chip different from the power semiconductor chip connected to the inner lead is mounted, adjacent to the inner lead, in the region of the lead frame to which the inner lead is bonded, and the notch is provided between the inner lead and the different power semiconductor chip.

3. The power semiconductor device according to claim 1, wherein a first edge and a second edge of the notch form an acute angle.

4. The power semiconductor device according to claim 1, wherein the notch is formed in a surface of the lead frame to which one of the inner leads is bonded.

5. The power semiconductor device according to claim 1, wherein
the region of the lead frame, in which the power semiconductor chip is mounted, has an extended portion which opposes the notch and protrudes into the inside of the notch.

6. The power semiconductor device according to claim 5, wherein
the power semiconductor chip different from the power semiconductor chip connected to the inner lead is mounted, adjacent to the inner lead, in the region of the lead frame to which the inner lead is bonded, and the notch is provided between the inner lead and the different power semiconductor chip.

7. The power semiconductor device according to claim 5, wherein
the notch is provided along at least one longitudinal end face of the inner lead.

8. The power semiconductor device according to claim 7, wherein
the notch is formed in a right triangle, and a hypotenuse of the right triangle is disposed parallel to the longitudinal end face of the inner lead.

9. The power semiconductor device according to claim 1, wherein
the notch is provided along at least one longitudinal end face of the inner lead.

10. The power semiconductor device according to claim 9, wherein
the notch is formed in a right triangle, and a hypotenuse of the right triangle is disposed parallel to the longitudinal end face of the inner lead.

11. The power semiconductor device according to claim 10, wherein
when a distance between the longitudinal end face of the inner lead and the notch is represented by L1, and a distance between the longitudinal end face of the inner lead and the electronic part adjacent to the longitudinal end face is represented by L2, L1 and L2 meet $0.5 \text{ mm} \leq L1 < L2$.

12. The power semiconductor device according to claim 10, wherein
when a distance between the longitudinal end face of the inner lead and the electronic part adjacent to the longitudinal end face is represented by L2, L2 meets $L2 \leq 5 \text{ mm}$.

13. The power semiconductor device according to claim 9, wherein
when a distance between the longitudinal end face of the inner lead and the notch is represented by L1, and a distance between the longitudinal end face of the inner lead and the electronic part adjacent to the longitudinal end face is represented by L2, L1 and L2 meet $0.5 \text{ mm} \leq L1 < L2$.

14. The power semiconductor device according to claim 13, wherein
when the distance between the longitudinal end face of the inner lead and the electronic part adjacent to the longitudinal end face is represented by L2, L2 meets $L2 \leq 5 \text{ mm}$.

15. The power semiconductor device according to claim 13, wherein
the electronic part is a current detection resistor.

16. The power semiconductor device according to claim 9, wherein
when a distance between the longitudinal end face of the inner lead and the electronic part adjacent to the longitudinal end face is represented by L2, L2 meets $L2 \leq 5 \text{ mm}$.

17. The power semiconductor device according to claim 16, wherein
the electronic part is a current detection resistor.

* * * * *